United States Patent [19]

Kahkoska

[11] Patent Number: 5,204,600

[45] Date of Patent: Apr. 20, 1993

[54] MECHANICAL DETENT SIMULATING SYSTEM

[75] Inventor: James Kahkoska, Colorado Springs, Colo.

[73] Assignee: Hewlett-Packard Company, Palo Alto, Calif.

[21] Appl. No.: 651,709

[22] Filed: Feb. 6, 1991

[51] Int. Cl.⁵ .............................................. G05B 19/29
[52] U.S. Cl. .............................. 318/602; 364/167.01; 341/16
[58] Field of Search ................................ 318/600–602, 318/626, 639, 823, 560, 567, 569, 603–605, 594, 590–591, 652–653; 364/167.01, 174; 341/11, 16–17, 15, 6

[56] References Cited

U.S. PATENT DOCUMENTS

| | | | |
|---|---|---|---|
| 4,588,936 | 5/1986 | Itoh et al. | 318/602 X |
| 4,611,269 | 8/1986 | Suzuki et al. | 318/602 X |
| 4,628,499 | 12/1986 | Hammett | 318/599 X |

Primary Examiner—William M. Shoop, Jr.
Assistant Examiner—David Martin

[57] ABSTRACT

An apparatus and method for simulating a mechanical detent in a manually operable rotary digital encoder typically used to control a display or readout in an associated electronic system. The output from the encoder to the electronic system is suspended for a predetermined time when the encoder shaft is rotated past a predetermined preset point. While the encoder output is suspended, the output signal $V_o$ to the electronic system is set at a level indicative of the preset point. The system user is thus able to quickly locate the preset point without overshooting it. If the user does, in fact, want to adjust the encoder past the preset point, the delay is of such a duration that it will have expired by the time the user repositions his hand on the encoder knob, thus allowing adjustment of the encoder to continue beyond the preset point.

30 Claims, 6 Drawing Sheets

MECHANICAL DETENT SIMULATING SYSTEM

BACKGROUND OF THE INVENTION

1. Field of the Invention

This invention relates generally to rotary encoded switches, or manually operable encoders, used in electronic systems, and more specifically, to a system which simulates a mechanical detent to facilitate control of user input from a manually operable encoder to an electronic system.

2. Statement of the Problem

Conventionally, manually operable rotary potentiometers using electrically resistive components have enabled users to provide input to electronic systems, such as oscilloscopes. Often, these rotary potentiometers have a physically detented center point representing a nominal center position of the potentiometer. This detented center position facilitates setting the potentiometer to the center position as the user encounters a noticeable impediment to rotation of the shaft when the potentiometer is rotated past the detented center position. This center position is hereinafter referred to as a preset point.

The use of microprocessors in electronic systems has led to the use of manually operable encoders, such as rotary encoded switches and rotary pulse generators, rather than potentiometers, as user input devices. An encoder, like a potentiometer, has a shaft connected to a rotatable element which rotates when a user turns the shaft or a knob attached to the shaft. Unlike a potentiometer, which is an analog device used for providing the associated electronic system with a variable resistive load, an encoder typically provides a passive digital indication of rotational position, which is read by a microprocessor to provide a signal indicative of a rotational displacement of the rotatable element. This signal is typically output to an associated electronic system to control a display or readout. A rotary pulse generator is similar to an encoder, but typically provides an active digital positional output signal, rather than a passive digital positional indication. The term "encoder" is hereinafter used to mean both "encoder" and "rotary pulse generator," unless "rotary pulse generator" is specifically indicated.

In further contrast to a potentiometer, there are no physical limits on the extent of rotation of the rotatable element in the encoder. The rotatable element can be rotated indefinitely in either direction without encountering a "stop". The rotatable element can be attached to a shaft, as in a rotary encoder, or it can be free to rotate in any direction, such as in the case of a "mouse," or a trackball, or a "joystick." The logical concept of a preset point still applies to encoders, however, and this document refers to the concept of a predetermined nominal encoder position indication as a "virtual" preset point.

The absence of physical rotational limits makes it difficult to quickly return to a preset point when using an encoder, as the user must typically focus on the readout or display associated with the encoder, while adjusting the encoder to the preset point in order, for example, to center the data being displayed via the readout. Since feedback from the readout to the user is visual, and since the displayed data may be changing or moving rapidly, then the user, trying to "zero in" on the preset point, often overshoots it, and goes through a series of iterations before setting the encoder exactly to the preset point. This problem is compounded when "acceleration" is used in the associated microprocessor controlling the input from the encoder to the electronic system.

Acceleration is a technique commonly used in electronic systems having encoders. Acceleration is used to allow an encoder to provide a large change in the encoder output with a relatively small rotational adjustment. When the encoder is rotated slowly, there is a one-to-one relationship between the rotational position of the encoder and the encoder output, which output is processed by the microprocessor before being sent to the associated electronic system. When the velocity of rotation of the encoder reaches a certain value, however, the microprocessor multiplies the encoder output by an acceleration factor, the value of which increases exponentially with the rotational velocity of the encoder shaft. This allows the user to effect a larger change in the output without having to rotate the encoder as far as would be necessary if the encoder were being rotated slowly.

3. Solution to the Problem

The system of the present invention models the tactile feedback of a physical detent by temporarily freezing the encoder output when the encoder is rotated past the virtual preset point (hereinafter "preset point"). The preset point for a given encoder is typically a position of the encoder rotatable element which corresponds to a predetermined signal. The preset point is usually a system default value stored in the microprocessor, although the preset point is also typically adjustable by a system user. When the user rotates the encoder past the preset point, the present system employs a time delay, during which, the output from the encoder to the associated electronic system is maintained at the preset point value. This delay is long enough to cause the user to physically run out of wrist or arm movement after passing through the preset point. More specifically, when the user rotates the encoder past the preset point at a normal, or particularly, at a fast speed, the delay is such that the output from the encoder to the electronic system is "frozen" at the preset point for a length of time sufficient for the user to complete the particular physical adjustment of the encoder. After the delay has expired, the preset point value continues to be output to the electronic system until the user again moves or rotates the encoder. Therefore, the user, having moved the encoder past a preset point, normally completes a particular encoder adjustment before the delay expires, during which time a constant preset point signal to the electronic system is maintained in place of the actual encoder position indication.

In order for the electronic system to recognize that the user desires to adjust the encoder past the preset point, the user need only to continue to rotate the encoder after the preset point has been crossed. After the delay has expired, actual encoder output to the electronic system is resumed when further movement of the encoder occurs. Therefore, regardless of the speed of rotation of the encoder by the user, or the acceleration factor implemented in the controlling microprocessor, the electronic system, for a predetermined length of time, "sees" the encoder as being set to the preset point, even if the user adjusts the encoder past the preset point. If the user does, in fact, want to advance or adjust the encoder past the preset point, the delay will have expired by the time the user repositions his hand on the encoder knob or the trackball, or repositions the mouse, thus allowing the user to continue to adjust the encoder beyond the preset point.

The method of the present invention also allows greater degrees of acceleration to be added to the encoder output, without compromising the user's ability to quickly adjust the encoder to the preset point, as any overshooting of the preset point is effectively nullified by the imposed delay.

DETAILED DESCRIPTION OF THE INVENTION

Figure 1:
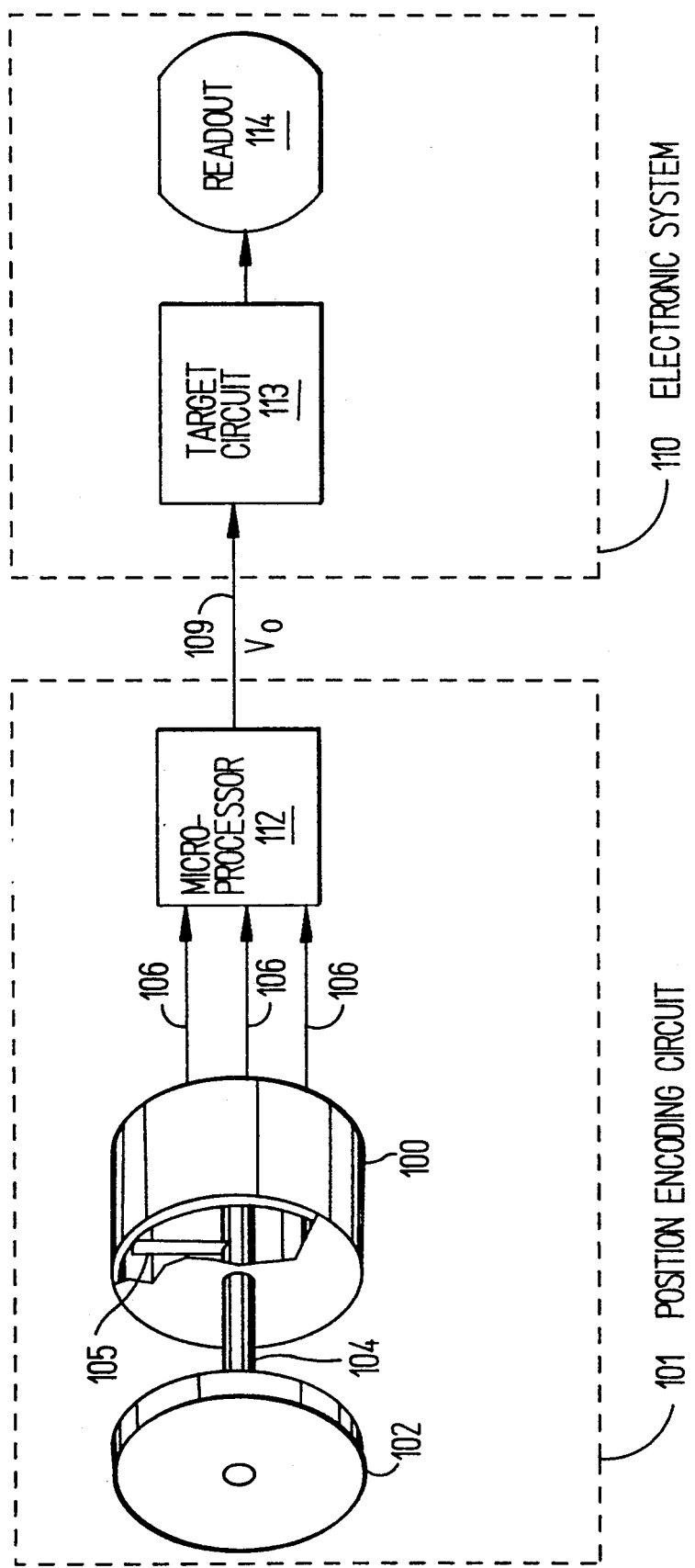
FIG. 1 shows, in block diagram form, the architecture of the apparatus of the present invention.

FIG. 1 shows a position encoding circuit 101 connected to an electronic system 110. The position encoding circuit 101 includes an encoder 100 which is connected to a microprocessor 112 by a plurality of lines 106. The encoder typically has a knob 102 located on a rotatable shaft 104, to which is attached a rotatable element 105. The rotatable element 105 provides a digital output on lines 106 which is a function of the position of the rotatable element 105. The electronic system 110 includes a target circuit 113 and a display or readout 114, such as a conventional analog meter, a cathode ray tube display, or a digital numeric display. Typically, the electronic system 110 is a piece of test equipment, but it is to be expressly understood that the present invention may be employed in other types of electronic systems 110.

Usually, the electronic system 110 has a plurality of encoders 100, each of which allows a user of the system to control a particular aspect of the display or readout 114. For example, if a signal wave form is being displayed on readout 114, the user may use one encoder to vertically center the waveform with respect to the readout 114, and another encoder to cause the waveform to move horizontally with respect to the readout 114.

For purposes of illustration, the encoder 100 contains a shaft 104, connected to a knob 102 which imparts rotation to a rotatable element 105 in the encoder 100 when the shaft 104 is rotated by a user (not shown). A typical encoder 100, such as, a Noble digital rotary encoder, part number 1B-TM-Y0001 contains a plurality of electrical contacts which are arranged such that they provide a digital binary bit pattern, hereinafter called "encoder position data," corresponding to the rotational position of the rotatable element 105 attached to the encoder shaft 104. The microprocessor 112 reads the encoder position data via a plurality of lines 106. The microprocessor 112 subsequently transmits over lead 109, to the associated electronic system 110, an encoder signal $V_o$ which is a function of the encoder displacement relative to the previous reading of the encoder position data. This signal $V_o$ is then typically used to control a readout 114 associated with the electronic system 110.

Figure 2:
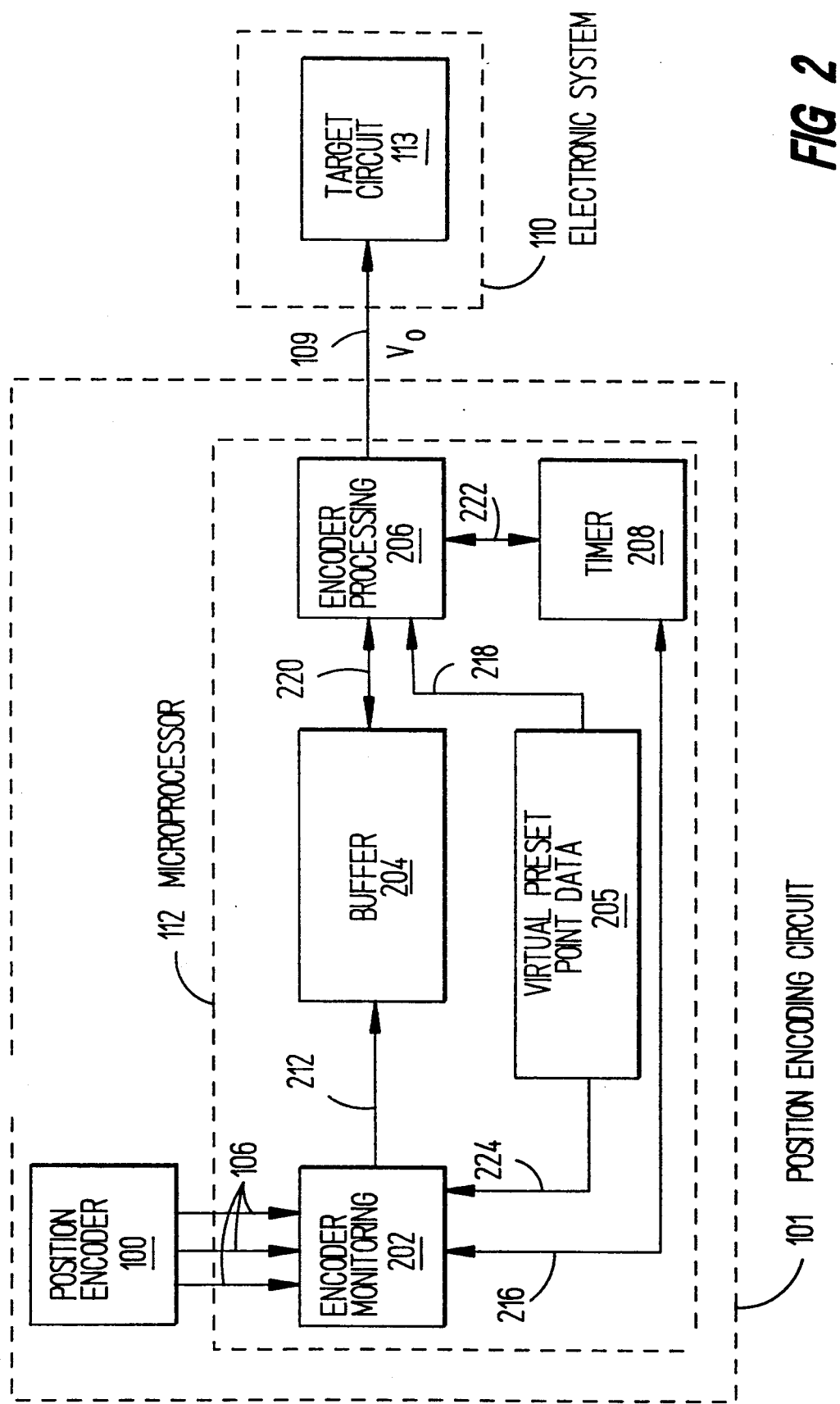
FIG. 2 is a block diagram of the position encoding circuit.

FIG. 2 illustrates, in block diagram form, the position encoding circuit 101. Referring to FIG. 2, the encoder monitoring circuit 202 accepts encoder position data input via a plurality of lines 106 from the encoder 100. Whenever the encoder monitoring circuit 202 detects a change in position of the encoder 100, as reflected in a change in encoder position data, the detected encoder position data is stored in a buffer 204 over line 212. The encoder processing circuit 206 periodically checks the buffer 204 via line 220 to determine whether any position encoder data has been placed therein. When the encoder processing circuit 206 finds encoder position data in the buffer 204, the data is processed according to predetermined parameters. For example, when the rotational velocity of the encoder shaft 104 reaches a predetermined value, an acceleration factor is included in the processing of the encoder position data. Typically, the acceleration factor is a stepped exponential function of the velocity of the encoder shaft 104. The processed encoder position data, hereinafter referred to as an "encoder position signal" $V_o$, is then transmitted over line 109 to a target circuit 113 in the associated electronic system 110. The target circuit 113 typically controls a display or readout 114 in the electronic system 110. The encoder position signal $V_o$ is maintained at a constant value until the encoder processing circuit 206 determines that the encoder position data in the buffer 204 indicates a change in rotational position of the encoder rotatable element 105.

The position encoding circuit 101 also contains data 205 indicative of the electronic system virtual preset point. If the encoder position data indicates that the encoder 100 has been rotated past the preset point, the microprocessor 112 sets a timer 208 via line 222, and encoder processing is suspended for a predetermined time interval, during which, a substituted signal $V_o$ indicative of the preset point is transmitted to the electronic system 110. After the time interval has elapsed, encoder processing is resumed.

1. Encoder Monitoring

Figure 3:
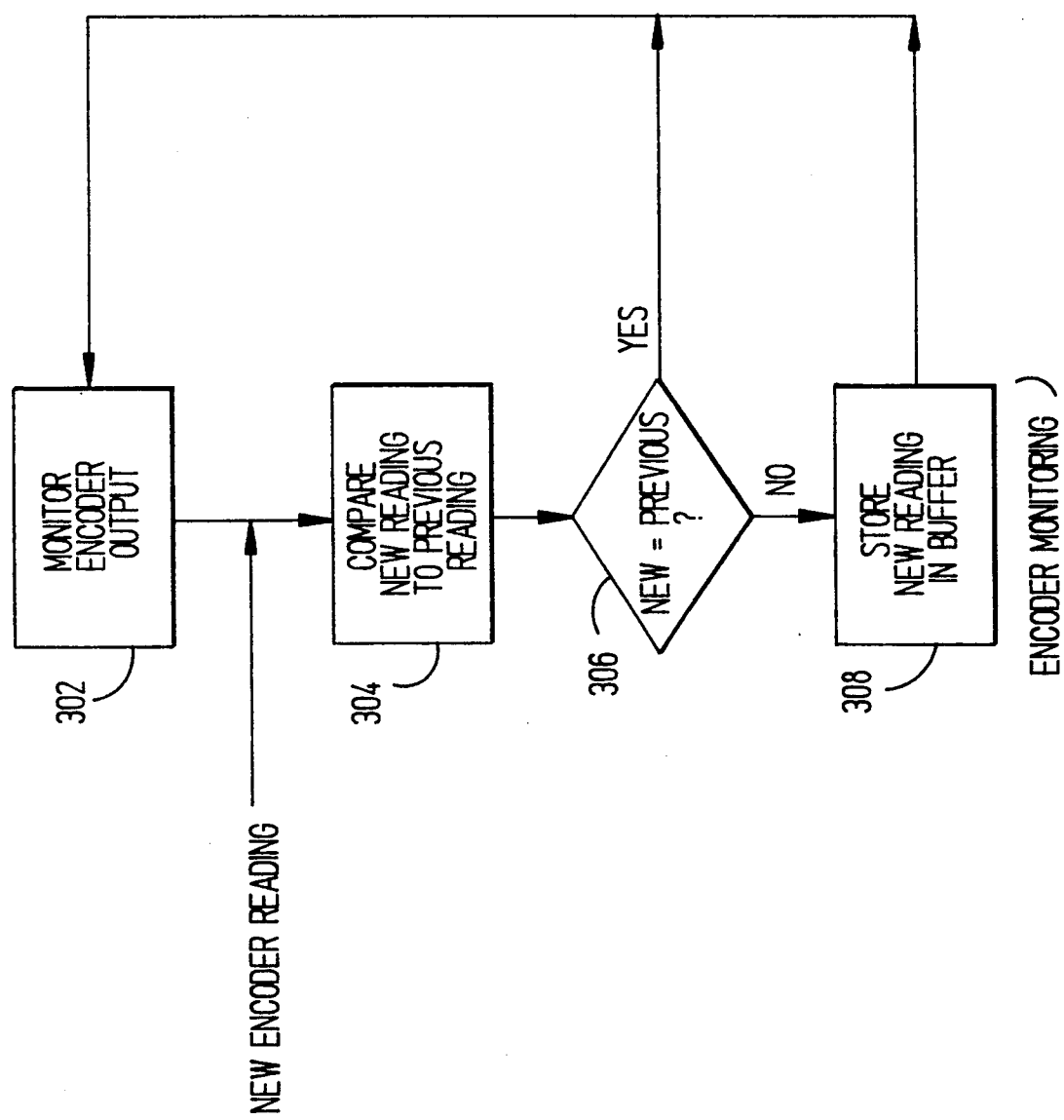
FIG. 3 is a flow chart of the encoder processing function.

FIG. 3 illustrates, in flow chart form, the encoder processing function. Referring to FIG. 3, at step 302, the microprocessor 112 reads the encoder position data output by the position encoder 100 over a plurality of lines 106 on a periodic basis, called a scan cycle, typically, every 2 milliseconds. The initial encoder position reading is stored in memory (not shown) accessible to the encoder monitoring circuit 202. Each time a new encoder position is read by the microprocessor 112, this new reading is compared, at step 304, with the previous stored reading to see whether the new reading is the same as the previous reading. If the new reading is the same as the previous reading, then at step 306, the microprocessor 112 waits until the next scan cycle to again compare encoder position readings. If, however, the new reading differs from the previous reading, the microprocessor 112 then stores data for the new reading, at step 308, in a buffer 204. Any difference between the new reading and the previous reading indicates that the encoder 100 has been rotated, and an entry in the buffer 204 is indicative of a change in rotational position of the encoder 100.

The encoder reading which is stored in the buffer 204 is determined by referring to the direction (left or right) in which the encoder 100 was last rotated, and the displacement relative to the previously read encoder position; therefore, the stored data for the encoder output reading indicates the relative displacement of the encoder rotatable element 105 between scan cycle intervals.

2. Encoder Processing

Figure 4:
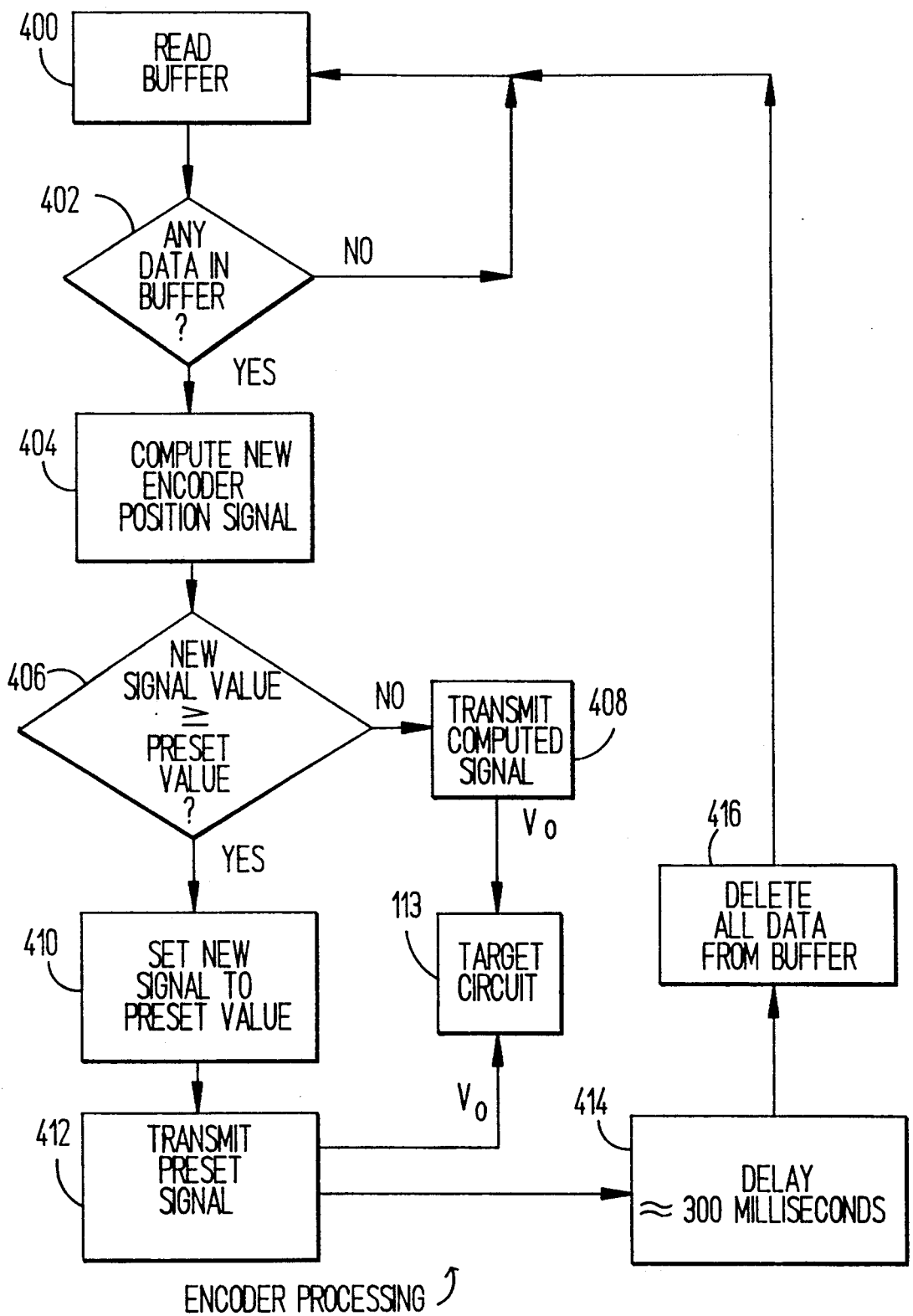
FIG. 4 is a flow chart showing the encoder monitoring function.

FIG. 4 shows the encoder processing logic of the present invention. It should be noted that encoder monitoring and encoder processing are asynchronous with respect to each other. At step 400, the microprocessor 112 reads the buffer 204 to determine if there is encoder position data in the buffer 204 to be processed. If it is determined, at step 402, that there is no data in the buffer 204, then the microprocessor 112 again reads the buffer 204 over line 220, at step 400, to determine whether any data has been placed therein. If, at step 402, encoder output data is found in the buffer 204, then, at step 404, an encoder position signal $V_o$, indicative of the buffer data, is generated on line 109. The encoder position signal $V_o$ is a function of both the position and the rotational velocity of the encoder shaft 104, and methods of generating the position signal $V_o$, given encoder position data, are well known in the art.

The generated position signal $V_o$ is then compared to the stored preset point value read over line 218, at step 406. If it is determined that the encoder shaft 104 was not rotated to or rotated past the preset point, then, at step 408, the generated position signal $V_o$ is output to the target circuit 113, and the microprocessor 112 again reads the buffer 204, looking for more encoder position data, at step 400. If, however, the generated encoder position signal $V_o$ is equal to the preset value, or if it is determined that the encoder shaft 104 was rotated past the preset point, then, at step 410, the generated encoder position signal $V_o$ is adjusted to equal the stored preset value 205, and at step 412, the generated preset point signal is output via lead 109 to the target circuit 113.

At step 414, a timer 208 is set via line 222, and the processing function is delayed, or suspended, for approximately 300 milliseconds, during which period of time, the encoder position signal $V_o$ remains at the preset point value. This delay is sufficient to allow the user of the electronic system 110 to recognize, via visual feedback from the readout 114, that the preset point has been reached or passed, and since the microprocessor 112 sets the encoder position signal $V_o$ to the preset point, the user does not have to position the encoder shaft 104 to an exact physical position in order to locate the preset point. After the delay, as produced by the timer 208, has expired, all of the data in the buffer 204 is deleted, at step 416, so that when the encoder processing function is resumed, spurious data is not processed.

The microprocessor 112 again reads the buffer 204, at step 400, in order to detect further encoder position data. After the buffer 204 data is deleted and the delay has expired, the user must further rotate the encoder shaft 104 before the encoder position signal $V_o$ is again processed. Therefore, after expiration of the delay, the encoder position signal $V_o$ remains fixed at the preset point value until the user further rotates the encoder shaft 104, since there is no data in the buffer 204 for the encoder processing circuit 206 to process until further rotation of the encoder shaft 104 is effected.

3. Waveform Diagram

Figure 5:
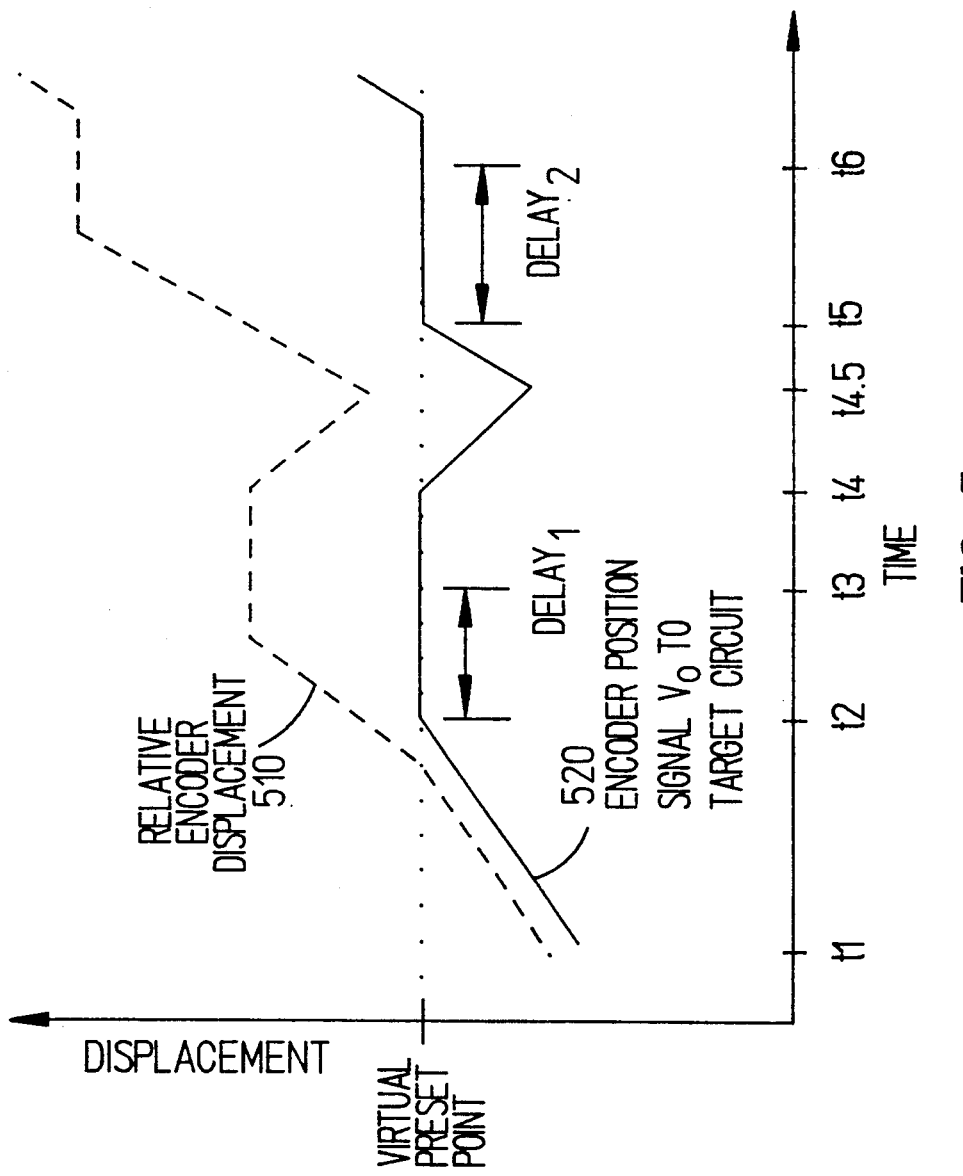
FIG. 5 is timing diagram showing the relationship between a typical encoder position signal and a relative displacement of the encoder rotatable element when the element is rotated past the preset point.

FIG. 5 shows the relationship, for explanatory purposes, between the actual displacement 510 of the encoder rotatable element 105, relative to the virtual preset point, and the displacement 520 of the rotatable element 105 as sent to the target circuit 113. The displacement 520 represents the processed encoder position signal $V_o$ transmitted from the position encoding circuit 101 to the target circuit 113 via lead 109.

Initially, from time t1 to time t2, the encoder position signal $V_o$ tracks the encoder element 105 displacement with a linear correspondence therebetween, assuming, for purposes of illustration, that no acceleration has been applied to the encoder displacement. At time t2, the encoder 100 crosses the virtual preset point, and delay$_1$ is effected. It can be seen that, although the encoder element 105 continues to be rotated during the delay, the encoder position signal $V_o$ remains at the preset point for the duration of the delay. By the expiration of the delay, at time t3, rotation of the encoder element 105 has stopped, typically, because the user has observed that the associated display has, for example, been centered. The encoder position signal $V_o$ remains thus constant until, at time t4, the encoder element 105 is again moved. Between time t4 and time t5, the encoder element 105 is moved away from, and then at time t4.5, back toward, the preset point, during which time, the encoder position signal $V_o$ again tracks the encoder element 105 displacement. At time t5, the preset point is again crossed, and delay$_2$ is effected, during which, the encoder position signal $V_o$ is again "frozen" at the preset point, even though the encoder element 105 continues to be rotated. After the delay has expired, the encoder position signal $V_o$ will continue to track the displacement of the encoder element 105, until a further preset crossing occurs.

4. Monitoring Circuit Delay

Figure 6:
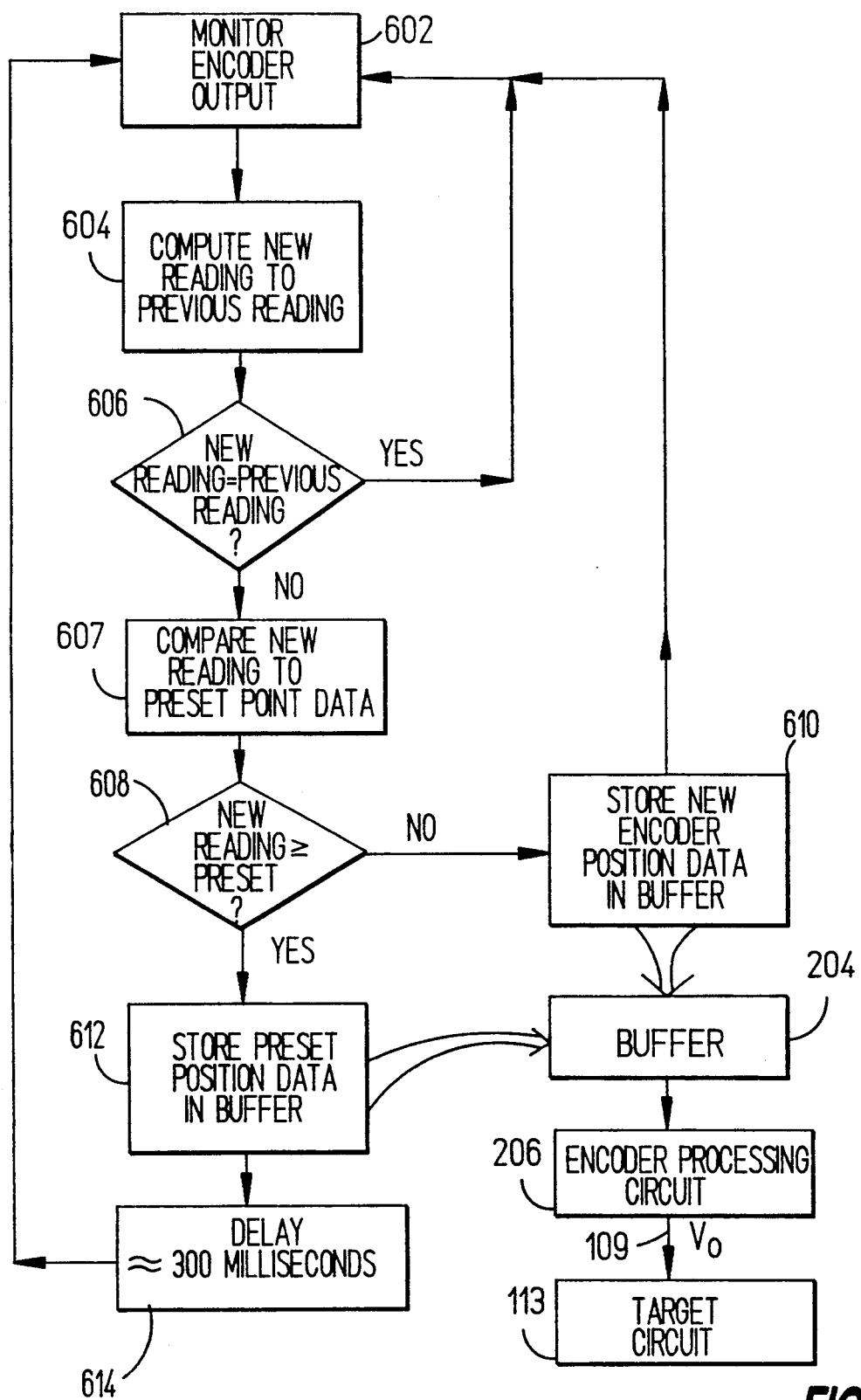
FIG. 6 is a flow chart of a monitoring circuit delay embodiment of the invention, showing both the encoder monitoring and encoder processing functions.

An alternative embodiment of the present invention employs a delay in the encoder monitoring circuit 202, rather than in the encoder processing circuit 206. Referring to FIG. 6, at step 602, the microprocessor 112 reads the encoder position on a periodic basis, typically, every 2 milliseconds. The initial encoder position reading is stored in memory (not shown) accessible to the encoder monitoring circuit 202. Each time a new encoder position is read by the microprocessor 112, this new reading is compared, at step 604, with the previous stored reading to see whether the new reading is the same as the previous reading. If the new reading is the same as the previous reading, at step 606, the microprocessor 112 again monitors the encoder position, looking for new encoder position data, at step 602. Note that steps 602, 604, and 606 correspond to steps 302, 304, and 306, respectively. If the new reading differs from the previous reading, then, at step 607, the new reading is compared to the stored preset point value. If it is determined that the encoder shaft 104 was not rotated to or rotated past the preset point, then, at step 610, the encoder position data is read over line 224 by the encoder monitoring circuit 202 and is stored is stored 616 in a buffer 204 via line 212. If, however, the computed encoder position signal $V_o$ is equal to the preset value, or if it is determined that the encoder shaft 104 was rotated past the preset point, then, at step 612, data equal to the stored preset data value 205 is read over line 224. The preset point data 205 is then stored in the buffer 204, and at step 614, a timer 208 is set via line 216, and the encoder monitoring function is delayed, or suspended, for approximately 300 milliseconds. This delay is sufficient to allow the user of the electronic system 110 to recognize, via visual feedback from the readout 114, that the preset point has been reached or passed. The microprocessor 112 again monitors the encoder position, looking for new encoder position data, at step 602.

The encoder position data processing circuit 618 processes 616 data in the buffer 204 asynchronously with respect to encoder monitoring 602 to determine an output position signal $V_o$ and outputs the processed encoder position signal $V_o$ to the target circuit 113.

It is to be expressly understood that the claimed invention is not to be limited to the description of the preferred embodiment but encompasses other modifications and alterations within the scope and spirit of the inventive concept.

I claim:

1. In an electronic system having a position encoding circuit having a manually adjustable position encoder connected to a target circuit and used to control an audio or a video function of said electronic system, said position encoder having a rotatable element capable of being continuously rotated through an angle of greater than 360 degrees in either direction, said position encoding circuit transmitting, to said target circuit, an encoder position signal indicative of said rotational displacement of said rotatable element, said position encoding circuit having a virtual preset point which is a rotational position of said rotatable element corresponding to a predetermined value of encoder position signal, an apparatus for locating said virtual present point for said position encoder comprising:

storing means for storing and outputting data indicative of said virtual preset point; and processing means for 1) comparing said encoder position signal and said data output by said storing means indicative of said virtual preset point and 2) setting, for a predetermined time interval, said encoder position signal equal to an encoder position signal indicative of said virtual preset point, when said processing means determines that said rotatable element in said position encoder has been rotated past said virtual present point.

2. The apparatus of claim 1, further comprising:

means for suspending, for said predetermined time interval, said transmitting of said encoder position signal indicative of said rotational displacement of said rotatable element.

3. The apparatus of claim 1, wherein:

said adjustable position encoder is a rotary digital encoder.

4. The apparatus of claim 1, wherein:

said adjustable position encoder is a rotary pulse generator.

5. The apparatus of claim 1, wherein:

said adjustable position encoder is selected from the group consisting of a trackball, a mouse, and a joystick.

6. A method for locating a virtual preset point for a position encoding circuit connected to an electronic system, said position encoding circuit having a manually adjustable position encoder, said position encoder having a rotatable element capable of being continuously rotated in either direction, said position encoding circuit transmitting an encoder position signal, indicative of a rotational displacement of said rotatable element, to a target circuit to control an audio or a video function of said electronic system, said position encoding circuit having data indicative of a virtual preset point, said virtual preset point being a rotational position of said rotatable element corresponding to a predetermined value of encoder position signal, said method comprising the steps of:

comparing said encoder position signal with said virtual preset point data; and setting, for a predetermined time interval, said encoder position signal equal to an encoder position signal indicative of said virtual preset point when said step of comparing determines that said rotatable element in said position encoder has been rotated past said virtual present point.

7. The method of claim 6, wherein:

said adjustable position encoder is a rotary digital encoder.

8. The method of claim 6, wherein:

said adjustable position encoder is a rotary pulse generator.

9. The method of claim 6, wherein:

said adjustable position encoder is selected from the group consisting of trackball, a mouse, and a joystick.

10. The method of claim 6, wherein:

said position encoder rotatable element is continuously rotatable through an angle greater than 360 degrees.

11. A method for locating a virtual preset point for a position encoding circuit connected to an electronic system, said position encoding circuit having a manually adjustable position encoder, said position encoder having a rotatable element capable of being continuously rotated in either direction, said position encoding circuit generating, repeatedly, an encoder position signal indicative of a rotational displacement of said rotatable element, said encoder position signal being transmitted to a target circuit to control an audio or a video function of said electronic system, said position encoding circuit having data indicative of a virtual preset point, said virtual preset point being a rotational position of said rotatable element corresponding to a predetermined value of encoder position signal, said method comprising the steps of:

comparing said encoder position signal with said data indicative of said rotational position of said virtual preset point;

setting, said encoder position signal equal to an encoder position signal indicative of said virtual preset point, when said step of comparing determines that said rotatable element in said position encoder has been rotated past said virtual preset point; and suspending, for a predetermined time interval, said encoder position signal generating when said step of setting is effected.

12. The method of claim 11, including the additional steps of:

storing encoder position data indicative of said rotational displacement of said rotatable element in a buffer; and reading, repeatedly, said encoder position data from said buffer; and wherein:

said encoder position signal is generated from said encoder position data read in said step of reading.

13. The method of claim 12, including the additional step of:

deleting all of said encoder position data in said buffer when said step of suspending has been performed.

14. The method of claim 12, including the additional step of:

interrupting, for said predetermined time interval, said step of storing when said step of suspending is effected.

15. The method of claim 11, wherein:
said step of setting is effected when said step of comparing determines that said rotatable element in said position encoder has been rotated to said virtual preset point.

16. The method of claim 11, wherein:
said adjustable position encoder is a rotary digital encoder.

17. The method of claim 11, wherein:
said adjustable position encoder is a rotary pulse generator.

18. The method of claim 11, wherein:
said adjustable position encoder is selected from the group consisting of a trackball, a mouse, and a joystick.

19. The method of claim 11, wherein:
said position encoder rotatable element is continuously rotatable through an angle greater than 360 degrees.

20. A method for locating a virtual preset point for a position encoding circuit connected to an electronic system, said position encoding circuit transmitting an encoder position signal to a target circuit to control an audio or a video function of said electronic system, said position encoding circuit having a manually adjustable position encoder associated with said electronic system, said position encoder having a rotatable element capable of being continuously rotated in either direction, said position encoding circuit having stored data indicative of a virtual preset point, said virtual preset point being a rotational position of said rotatable element corresponding to a predetermined value of said encoder position signal, said method comprising the steps of:
monitoring a position of said rotatable element to determine a rotational displacement, from a previously monitored position, of said rotatable element;
storing, in a buffer, data indicative of said rotational displacement;
generating, from said data in said buffer, said encoder position signal indicative of said rotational displacement;
comparing said encoder position signal with said data indicative of said virtual preset point;
transmitting, to said target circuit, said encoder position signal indicative of said displacement, when said step of comparing determines that said rotatable element has not been rotated past said virtual preset point;
suspending, for a predetermined time interval, said step of generating when said step of comparing determines that said rotatable element has been rotated past said virtual preset point;
transmitting to said target circuit, for said predetermined time interval when said step of suspending is effected, a said encoder position signal indicative of said virtual preset point; and
deleting all of said encoder position data in said buffer, when said step of suspending has been effected, after said predetermined time interval has expired.

21. The method of claim 20, wherein said step of suspending suspends said step of generating when it is determined that said rotatable element in said position encoder has been rotated to said virtual preset point.

22. The method of claim 20, wherein:
said adjustable position encoder is a rotary digital encoder.

23. The method of claim 20, wherein:
said adjustable position encoder is a rotary pulse generator.

24. The method of claim 20, wherein:
said adjustable position encoder is selected from the group consisting of a trackball, a mouse, and a joystick.

25. The method of claim 20, wherein:
said position encoder rotatable element is continuously rotatable through an angle greater than 360 degrees.

26. A method for locating a virtual preset point for a position encoding circuit connected to an electronic system, said position encoding circuit transmitting an encoder position signal to a target circuit to control an audio or a video function of said electronic system, said position encoding circuit having a manually adjustable position encoder associated with said electronic system, said position encoder having a rotatable element capable of being continuously rotated in either direction, said encoder position signal being indicative of a rotational displacement of said rotatable element, said position encoding circuit having associated stored data indicative of a virtual preset point, said virtual preset point being a rotational position of said rotatable element corresponding to a predetermined value of encoder position signal, said method comprising the steps of:
monitoring a position of said rotatable element of said position encoder to determine a rotational displacement, from a previously monitored position, of said rotatable element;
comparing said rotational displacement with said data indicative of said virtual preset point;
storing, in a buffer, data indicative of said rotational displacement, when said step of comparing determines that said rotatable element has not been rotated past said virtual preset point;
storing, in said buffer, data indicative of said virtual preset point, when said step of comparing determines that said rotatable element has been rotated past said virtual preset point;
suspending, for a predetermined time interval, said step of monitoring when said step of storing said virtual preset point data is initially effected; and
generating said encoder position signal from said stored data in said buffer.

27. The method of claim 26, wherein:
said adjustable position encoder is a rotary digital encoder.

28. The method of claim 26, wherein:
said adjustable position encoder is a rotary pulse generator.

29. The method of claim 26, wherein:
said adjustable position encoder is selected from the group consisting of a trackball, a mouse, and a joystick.

30. The method of claim 26, wherein:
said position encoder rotatable element is continuously rotatable through an angle greater than 360 degrees.

* * * * *